United States Patent [19]

Honda et al.

[11] 3,835,412

[45] Sept. 10, 1974

[54] TRANSISTOR AMPLIFIER PROTECTIVE CIRCUIT

[75] Inventors: Masatsugu Honda; Masanobu Shinozaki, both of Yokohama, Japan

[73] Assignee: Victor Company of Japan Limited

[22] Filed: Nov. 2, 1973

[21] Appl. No.: 412,092

[30] Foreign Application Priority Data

Nov. 6, 1972 Japan .............................. 47-127171
Dec. 7, 1972 Japan .............................. 47-122043
Dec. 7, 1972 Japan .............................. 47-122044

[52] U.S. Cl. .............. 330/207 P, 317/33 R, 330/51
[51] Int. Cl. ............................................. H03f 1/00
[58] Field of Search .............. 330/11, 207 P, 29, 51; 317/33 R; 307/202

[56] References Cited

UNITED STATES PATENTS 3,735,203 5/1973 Fujie et al. ...................... 330/207 P

*Primary Examiner*—Herman Karl Saalbach
*Assistant Examiner*—James B. Mullins
*Attorney, Agent, or Firm*—Robert E. Burns; Emmanuel J. Lobato; Bruce L. Adams

[57] ABSTRACT

A protective circuit for protecting a transistor amplifier against excessive current flowing therethrough, which comprises voltage response switching means, and improved control means, provided for protecting the transistor amplifier. The improved control means is intended to control the sensitivity of the voltage responsive switching means.

5 Claims, 13 Drawing Figures

TRANSISTOR AMPLIFIER PROTECTIVE CIRCUIT

This invention relates generally to an improved protective electronic circuit and particularly an improved protective electronic circuit for protecting a transistor amplifier from suffering damage due to excessive current flowing therethrough.

It is generally known, that in circuit design of an active-circuit such as a transistor amplifier, particular attention with respect to the collector current must be paid in not exceeding the maximum allowable forward current rating established by a manufacturer, since the transistor might suffer irreversible damage in the case of excessive current flowing therethrough. That is, the excessive current causes power dissipation to increase at the collector-base junction with increasing temperature thereof and then the temperature rise at the junction finally results in destroying the transistor permanently. Moreover, the excessive current trends to invite a so called "second breakdown", which occurs so suddenly that the thermal time constant of the collector regions is exceeded and the transistor is irrecoverably damaged. From the above reasons, heretofore, various protective circuits have been developed. In the following detailed description, there is shown a protective operation in combination with a functional block diagram according to the prior art. In FIG. 1 there is illustrated a functional block diagram for convenient explanation of the protective operation in accordance with the prior art. A transistor amplifier to be protected from the excessive current flowing therethrough is denoted by numeral 1. An input signal is supplied to an input terminal 6 of the amplifier 1 and being amplified thereby. The amplified electric signal is then delivered to a load 3 by way of a relay 4. In order to accomplish the protection of the amplifier 1 from the above-mentioned excessive current, there is provided a voltage responsive switching means 2. In this prior art, to detect the excessive current flowing through the transistors of the amplifier, there is employed a magnitude of voltage variations correspondingly varying with that of the amplifier's output current. The voltage variations are derived from a terminal 8 of the amplifier and supplied to the voltage responsive switching means 2, which includes a semiconductor switching device **2*a* and a relay 4. Upon the magnitude of the voltage variations attaining a preset response level of the semiconductor switching device, it is rendered conductive so that a relay arm 4*a* is caused to disengage a relay contact 4*b*. In this way, by breaking the circuit connection between the load 3 and the output terminal 7 of the amplifier 1**, the protective operation is accomplished.

However, substantial problems are encountered in the above-mentioned prior art as described below. It is apparent that the magnitude of the output current variations depends on two factors, that is, the variations of the magnitude of both load impedance and the input signal. However, in the prior art as mentioned above, the on-off switching action depends solely on the resultant magnitude of the voltage variations correspondingly varying with that of the output current, so that the switching means cannot directly respond to the magnitude of the above-mentioned factor's variations. Therefore, the several defects inherent to the prior art can be pointed out as follows. The switching level must be tediously determined in the circuit design of every amplifier. This predetermined switching level restricts the protecting operation range to a narrow one. That is, when the switching level is previously determined to be low, the protective operation might take place even in normal amplification; on the contrary, when the switching level is set relatively high, the possibility of non-operation of the switching means even in abnormal amplification exists. Moreover, since the output impedance of the transistor amplifier is considerably low, the amplifier behaves as if it is a constant voltage power source. Therefore, in the case where the switching level is so arranged that it actuates when the load impedance is the minimum allowable one and simultaneously input signal is relatively large, the voltage responsive switching means cannot discriminate whether the large magnitude of the voltage variations derived from the terminal 8 of FIG. 1 is caused by a normal operation or an abnormal one (that is, the load impedance is lower than the minimum allowable one, but at the same instant the input signal is large enough to generate the magnitude of the voltage variations which exceed the switching level). In the latter case, the transistors might be subject to irrecoverable damage.

The present invention is, therefore, intended to obviate the above-mentioned disadvantages. A first embodiment of a protective circuit according to the present invention is provided with impedance control means which changes its impedance by varying the magnitude of the output signal such that the level is caused to become lower or higher with decrease or increase of the output signal's magnitude, respectively, and such that the response level is caused to be minimum when the load impedance is short-circuited. Therefore, provided that the voltage responsive switching level is previously so arranged that the switching means is actuated when the load impedance is zero and at the same instant the input signal is considerably large, then the protecting operation is completely accomplished. A second embodiment of a protective circuit according to the present invention is intended to actuate the voltage responsive switching means without failure solely when the load impedance is short-circuited, so that the worst condition to the amplifier can be avoided. A third embodiment of a protective circuit according to the present invention provides improved means for detecting the variations of the load impedance and controlling in magnitude the voltage variations correspondingly varying with that of the output current. According to the provision of the above means in accordance with the third embodiment, the response range of the voltage responsive switching means can be widened.

It is therefore a primary object of the present invention to provide an improved circuit configuration which varies its impedance by varying the magnitude of an output signal from an amplifier in order to control in magnitude a supplied voltage to a voltage responsive switching means.

Another object of the present invention is to provide an improved circuit configuration which actuates without failure a voltage responsive switching means in order to break a circuit connection between an output terminal of an amplifier and its load, when the load impedance is short-circuited.

Still another object of the present invention is to provide an improved circuit configuration which detects variations of an output impedance and controls in magnitude a supplied voltage to a voltage responsive switching means.

These and other objects, features and many of the attendant advantages of this invention will be appreciated more readily as the same becomes better understood by reference to the following detailed description, when considered in connection with the accompanying drawings, wherein like parts in each of the several figures are identified by the same reference characters, and wherein.

Figure 1:
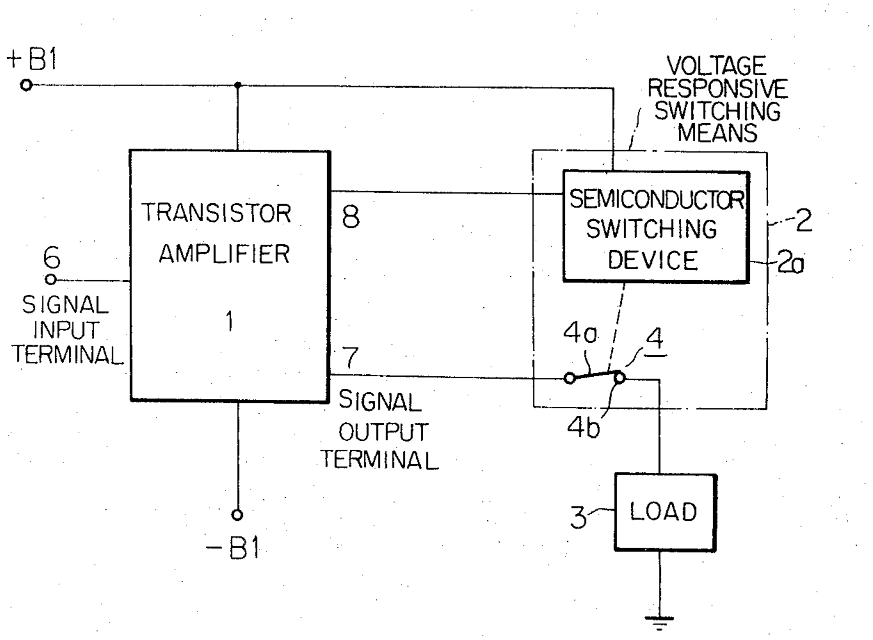
Fig. 1 (PRIOR ART)
FIG. 1 is a functional block diagram in accordance with prior art showing a transistor amplifier to be protected and an amplifier protective means.
Figure 2:
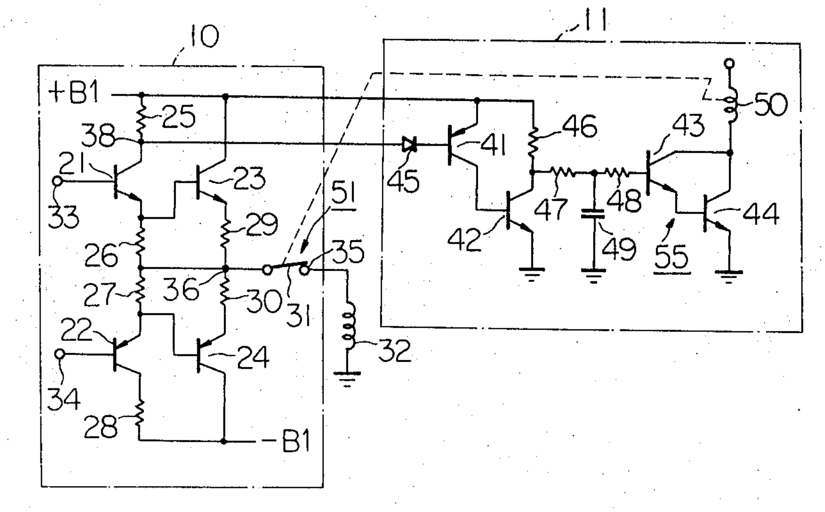
Fig. 2 (PRIOR ART)
FIG. 2 is a detailed circuit diagram in accordance with prior art, which shows a transistor to be protected and an amplifier protective circuit.

Prior to the detailed description of a first preferred embodiment of a circuit configuration in accordance with the present invention, reference is made to FIG. 2 which shows a protective circuit in accordance with a first prior art for use with a transistor amplifier to be protected. A phantom line block 10 denotes a transistor amplifier, which is a push-pull class B amplifier using complementary symmetry, i.e., using two N-P-N and two P-N-P transistors, and a type without an output transformer and an output capacitor. An electric signal supplied to input terminals 33 and 34 is amplified by driver stage transistors 21 and 22, and further amplified by power stage transistors 23 and 24, then energizes a load 32 by way of a relay 51. A voltage responsive switching means, which is indicated by a phantom line block 11, is provided for protecting the amplifier 10 from excessive current flowing through the transistors thereof. The amplifier protection according to the prior art circuit configuration of FIG. 2 is accomplished as described below in detail. Voltage variations appearing at a junction 38 of the driver stage transistor 21 is supplied to a base of a primary stage transistor 41 of the voltage responsive switching means 11 by way of a diode 45. It is to be noted that the magnitude of the voltage variations is proportional to that of the output signal current which is fed to the load 32 from an output terminal 36 of the amplifier 10. In a normal operation of the amplifier, the transistor 41 and a transistor 42 of the voltage responsive switching means are designed to be non-conductive while the transistors 43 and 44 forming a Darlington amplifier 55 are designed to be conductive, so that a collector current flowing through a coil 50 of an electromagnetic relay 51 holds a relay switch arm 31 engaged with its relay contact 35. This means that the amplifier continues to supply electric energy to the load 32. In such an arrangement, when the excessive output current flows through the load 32 due to, for example, a remarkable reduction of the load impedance, then the magnitude of the voltage variations to be supplied to the voltage responsive means 11 are enhanced because it correspondingly varies with the magnitude of the output signal current. This enhancement of the magnitude of the voltage variations causes the transistor 41 to render conductive and as a result the transistor 42, which is directly coupled to the transistor 41, also becomes conductive. In such a case, a potential of a junction between resistors 46 and 47 becomes approximately equal to the ground potential, that is, zero, so that the Darlington amplifier 55 is rendered non-conductive due to the zero potential of the base electrode of the transistor 43, thus resulting in ceasing to supply electric energy to the coil 50. As a natural result, the arm 31 of the relay 51 is caused to disengage the relay contact 35 so that the circuit connection between the amplifier 10 and the load 32 is broken. In this manner, the transistors of the amplifier 10 are protected from suffering damage due to excessive current flowing therethrough. In the above-described prior art circuit configuration, however, substantial problems are encountered, which have been pointed out in detail in the foregoing description.

Figure 3:
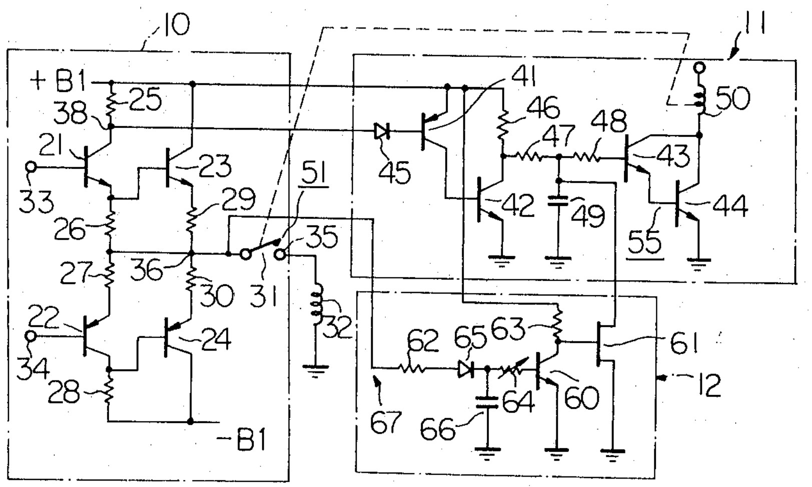
FIG. 3 is a detailed circuit diagram in accordance with the present invention, wherein an improved impedance variable means is added to the FIG. 2 circuit.

In FIG. 3 there is illustrated a first preferred embodiment of a protective circuit in accordance with the present invention, which is intended to obviate the aforementioned defects. In brief, the present embodiment is provided with impedance control means in addition to FIG. 2 prior art circuit configuration. The impedance control means changes its impedance by varying the magnitude of the output signal such that the response level is caused to become lower or higher with decrease or increase of the output signal's magnitude, respectively, and such that the response level is caused to be maximum when the load impedance is short-circuited. Therefore, provided that the voltage responsive switching level is previously so arranged that the switching means is actuated when the load impedance is short-circuited to the ground and simultaneously the input signal is considerably large, then the protection is completely accomplished. The feature of the first embodiment of a circuit configuration in accordance with the present invention resides in the provision of the impedance control means indicated by numeral 12. An input terminal 67 of the impedance control means 12 is coupled to the output junction terminal 36 of the amplifier 10 and derives an output eltric signal therefrom. The derived output electric signal is supplied to the impedance control means 12 and rectified and smoothed by a diode 65 and a capacitor 66, then the rectified and smoothed electric energy is supplied to a base of a transistor 60 via a variable resistor 64. The variable resistor 64 is provided for adjusting the base resistance of the transistor 60 to a suitable value. It is to be noted that the current flowing through the collector and emitter of the transistor 60 is varied correspondingly with the magnitude of the signal current supplied to the base thereof and also noted that the current variations cause a potential appearing at the collector of the transistor 60 to change. The collector electrode is coupled to a gate of a FET (field effect transistor) 61. Therefore, an impedance between the source and drain of the FET 61 is varied correspondingly with the voltage being supplied to the gate of the FET 61. As seen in FIG. 3, the source electrode of the FET 61 is coupled to the junction between the resistors 47 and 48 of the voltage responsive switching means 11, so that the FET 61 provides a shunt-circuit with respect to a capacitor 49. When the output signal energy is large, the rectified and smoothed direct voltage being supplied to the base of the transtor 60 is correspondingly large, then the collector voltage of the transistor 60 is reduced due to the reduction of the impedance between the collector and emitter thereof, so that the impedance between the source and drain of the FET 61 is reduced. Consequently, the base current supplied to the base of the transistor 43 is reduced so that the output current of the Darlington amplifier 55 is correspondingly decreased, thus resulting in decreased current flow through the coil 50. From the foregoing description, it is understood that increase of the output signal current causes reduction of the impedance between the source and drain of FET 61, which in turn causes the sensitivity of the voltage response switching means to reduce. Similarly, it is understood that decrease of the output signal current causes the sensitivity of the voltage responsive switching means to increase. In the present circuit arrangement, when the lead 32 is short-circuited to the ground, the impedance between the source and drain of the FET 61 becomes infinite so that the sensitivity of the voltage responsive switching means reaches its maximum. It is to be noted that the FET 61 can be substituted by a suitable semiconductor device such as a transistor.

Figure 4:
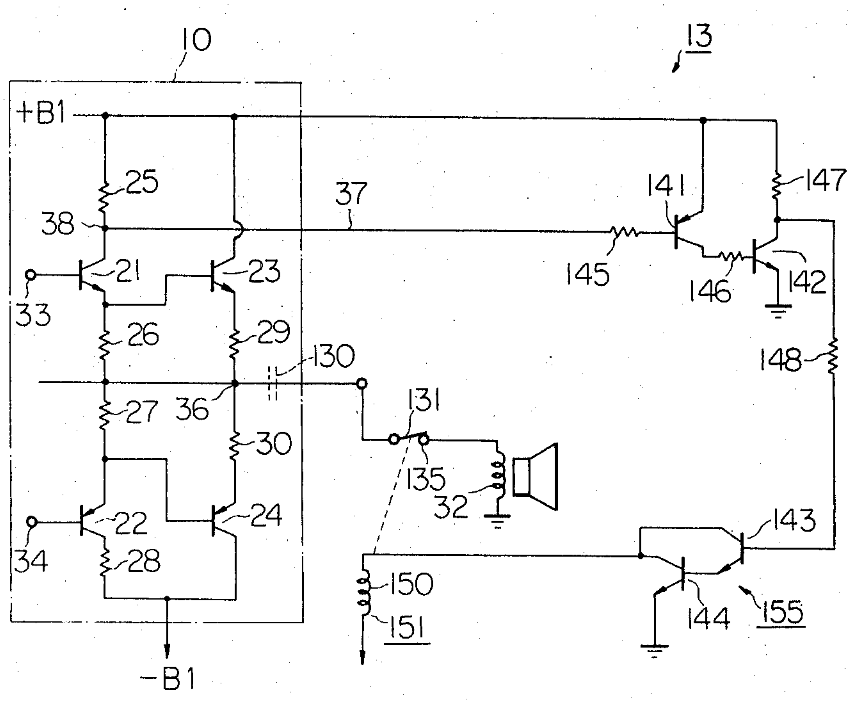
Fig. 4 (PRIOR ART)
FIG. 4 is an another detailed circuit diagram in accordance with prior art, which shows a transistor to be protected and an amplifier protective circuit.
Figure 5:
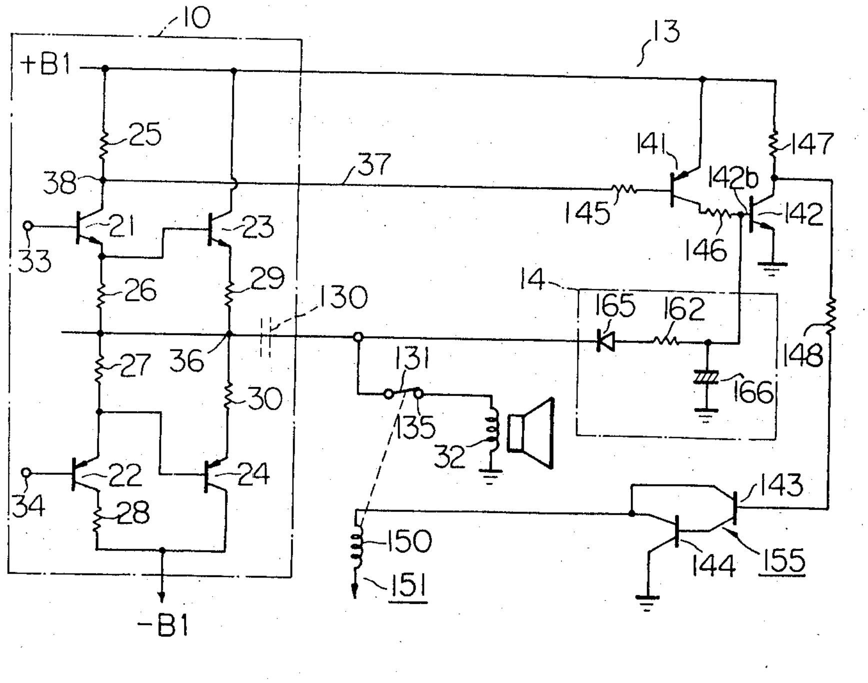
FIG. 5 is an another detailed circuit diagram in accordance with the present invention wherein an improved control means for controlling the amplifier protective circuit of FIG. 4 is added to FIG. 4 circuit.

Now reference is made to FIGS. 4 and 5, wherein there are shown a second prior art circuit configuration and a second embodiment of a protective circuit in accordance with the present invention, respectively. In the following, the protective operation of the FIG. 4 circuit will be described in detail. The voltage variations appearing at the junction 38 are derived and supplied to a voltage responsive switching means 13. It is to be noted that the thus derived voltage variations are correspondingly varied with output current variations being supplied from an output terminal 36 to a load 32. A base electrode of a primary stage transistor 141 of the voltage responsive switching means 13 is coupled via a resistor 145 to the collector of the transistor 21 for receiving the voltage variations appearing thereat. The transistor 141 is designed to be non-conductive under normal amplifying operation of the amplifier 10 and to be rendered conductive when the magnitude of the voltage variations is enhanced by abnormal increase of the output current. In normal amplifying operation, there is no input current to the base of a successively coupled transistor 142 due to the cut-off state of the transistor 141, so that it is also non-conductive. Therefore, the direct current from the power supply source B1 is delivered to a coil 150 of an electromagnetic relay 151 through resistors 147 and 148 and a Darlington amplifier 155 consisting of transistors 143 and 144. Consequently, the electromagnetic relay 151 holds its relay arm 131 engaged with its relay contact 135. Therefore, the amplifier continues to supply electric energy to the load 32. In such a circuit arrangement, when an excessive output current flows to the extent that the magnitude of the voltage variations is sufficient to render the transistor 141 conductive, as a result the transistor 142 is also rendered conductive. Therefore, the current from the power supply source B1 is bypassed to the ground so that the coil 150 stops generating a magnetic flux, thus resulting in the arm 131 disengaging the contact 135. In such a manner, the transistor of the amplifier can be protected from suffering damage due to excessive current flowing therethrough. A capacitor 130 indicated by dotted lines represents an output capacitor and its position shown in the case where it is incorporated into the amplifier. However, in the above-mentioned prior art of FIG. 4, there can be pointed out the problems as have been seen in the foregoing description. That is, even if the load 32 be shorted, the voltage responsive switching means 13 might not respond to the undesirable condition unless the input signal to the amplifier is so large that the voltage variations do reach the preset sensitive level. If the above undesirable condition continues, the transistors used in the amplifier 10 might suffer irrecoverable damage.

To obviate the disadvantage inherent to the prior art of FIG. 4, an improved control means in accordance with the present invention is added to FIG. 4 prior art circuit. In brief, the FIG. 5 circuit configuration is provided for breaking a circuit connection between the output terminal 36 of the amplifier 10 and the load 32 in case where the load 32 is short-circuited to the ground. Now reference is made to FIG. 5, wherein there is shown control means 14 to obtain the above result. The control means 14 comprises a half-wave rectifying diode 165 the cathode of which is connected to the output terminal 36 of the amplifier through the capacitor 130 for deriving and rectifying the output current, an usual resistance-capacitance filter (consisting of a resistor 162 and a capacitor 166) being provided for reducing the ripple factor of the rectified electric output signal. Then, the rectified and filtered voltage is supplied to the base **142*b* of the transistor 142. In this case, since the cathode terminal of the diode 165 is connected to the output terminal 36 only the negative half-wave of the output signal might be passed therethrough. Therefore, the rectified and filtered direct current voltage being delivered to the base 142*b* of the transistor 142 causes the base potential thereof to reduce. The purpose of the supply of the direct current voltage from the control means 14 to the base 142*b* is that the transistor 142 is not rendered conductive provided that the load 32 is not short-circuited to the ground, even if the transistor 141 is in conductive condition. In such a circuit arrangement, when the load 32 is short-circuited, no output voltage is generated at the output terminal 36 of the amplifier so that the rectified and filtered voltage stops reducing the base potential of the transistor 142. Consequently, the large magnitude of the voltage variations developed across the collector resistor 25 due to the short-circuited output terminal 36 causes the transistor 141 to be rendered conductive, and the successive transistor 142 is also rendered conductive as a natural result. In this manner, by preventing current from flowing through the coil 150, the transistors 21 and 22 of the amplifier 10 are protected from suffering damage due to the short-circuited output terminal 36**.

Figure 6:
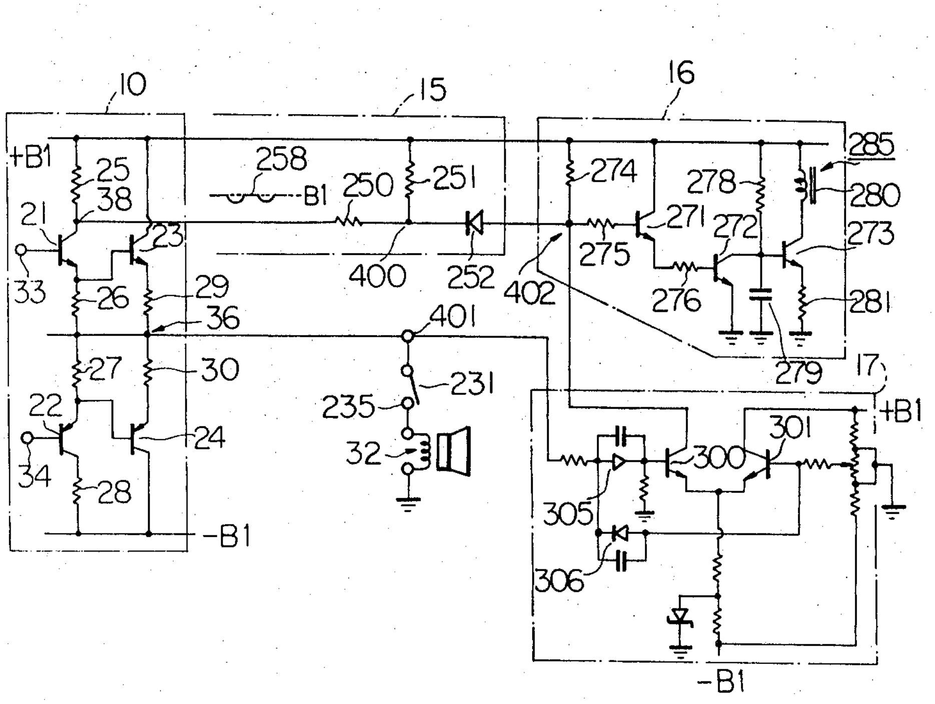
Fig. 6 (PRIOR ART)
FIG. 6 is an another detailed circuit diagram in accordance with prior art, which illustrates a transistor amplifier to be protected and an amplifier protective circuit.
Figure 7:
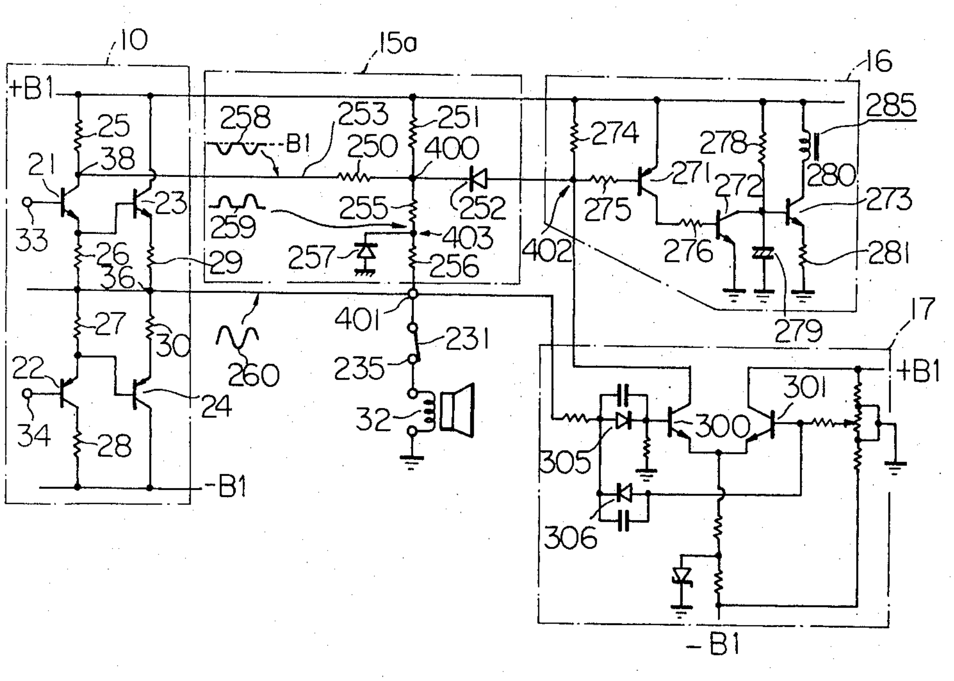
FIG. 7 is an another detailed circuit diagram in accordance with the present invention wherein another improved control means or controlling the amplifier protective circuit of FIG. 6 is added to the FIG. 6 circuit.

In FIGS. 6 and 7 there are shown a third prior art circuit configuration and a third embodiment of a protective circuit in accodance with the present invention, respectively. The FIG. 7 embodiment is an improvement of the FIG. 6 circuit. In general, the protecting operation according to the prior art is as follows. The large magnitude of voltage variations correspondingly varying with excessive output current causes a voltage responsive switching means 16 to actuate in order to break the circuit connection between the output terminal 36 of the amplifier 10 and the load 32. In addition, in the present case, another protecting means indicated by numeral 16 is provided for detecting an excessive direct voltage developed at the output terminal 36 and serving also to break the circuit connection between the load 32 and the output terminal 36. The protecting means 16 comprises generally a conventional differential amplifier whose output is proportional to the difference between the direct current voltage appearing at the output terminal 130 and the predetermined direct current voltage. However, this protecting means 16 is not concerned with this embodiment of a protective circuit in accordance with the present invention, so that a detailed description will be omitted. Assume that the d.c. voltage of the output terminal 36 is balanced with the predetermined d.c. potential to be compared therewith. In the following, the protecting operation according to FIG. 6 will be described in detail. For simplifying the explanation of the protective operation, it is assumed that the waveform of the input signal is approximately sinusoidal. The voltage variations appearing at the junction 38 are derived from the amplifier 10 and supplied to detecting means denoted by numeral 15. At this point, it is to be noted that a portion corresponding to each positive half-cycle of the input signal appears in the reverse polarity at the junction 38 and also noted that the positive peak of each of the waveforms of the voltage variations is flat and equal to the power supply voltage as indicated by numeral 258 (also in FIG. 8). Thus obtained voltage variations are divided by voltage dividing resistors consisting of resistors 250 and 251. The voltage appearing at a junction 400 of the voltage dividing resistors is delivered to the base of a primary stage transistor 271 of the voltage responsive switching means 16 by way of a rectifying diode 252 and a base resistor 275. In this case, since the diode 252 passes only the voltage variations below the power source potential therethrough because the potential at a junction 402 is equal to that of the power supply source, then the base potential of the transistor 271 is reduced below the power source potential. When the reduction of the base potential of the transistor 271 exceeds a predetermined level, the transistor 271 is rendered conductive, thus resulting in rendering transistors 272 and 273 also conductive. Consequently, a coil 280 of relay 285 is energized by the collector current through the transistor 273, so that a relay arm 231 is caused to disengage a relay contact 235. In this manner, protection of the amplifier from the excessive output current is obtained.

Figure 8:
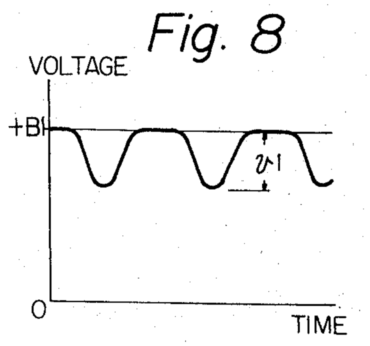
FIGS. 8–13 illustrate a series of waveform typifying two kinds of voltage variations derived from the amplifier of FIG. 7 and their combined voltage relationships.
Figure 9:
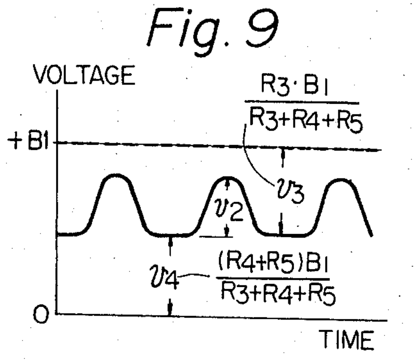
Figure 10:
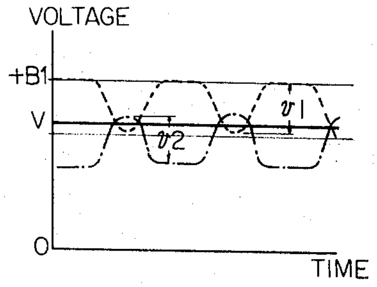
Figure 11:
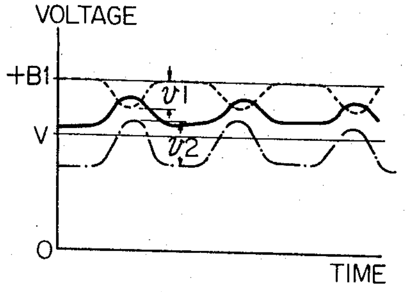
Figure 12:
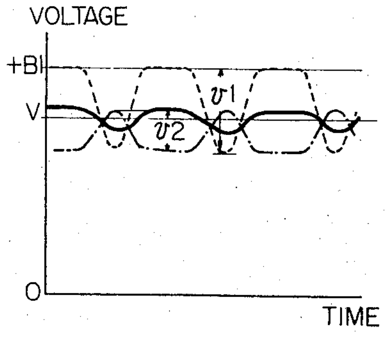
Figure 13:
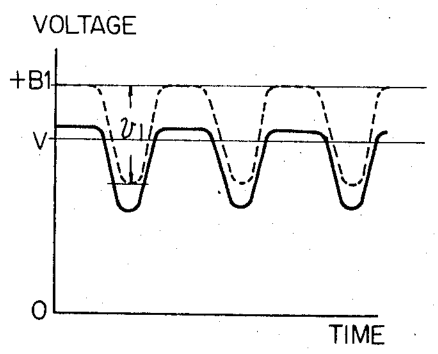

However, there are several problems in the above-mentioned prior art circuit configuration. That is, the voltage responsive swiching means 16 only depends on the magnitude of the voltage variations, so that the switching means 16 cannot discriminate whether a large current through a load 32 is a result of normal operation or an abnormal one. The disadvantage has been pointed out in the preceding description. In FIG. 7 there is shown the improved circuit diagram of the FIG. 6 prior art, which is intended to obviate the defects inherent to FIG. 6 prior art. The feature of the FIG. 7 embodiment of a protective circuit in accordance with the present invention resides in an improved circuit configuration indicated by a phantom line block 15*a*, wherein there are interposed two resistors (255 and 256) and a diode 257 between the junction 400 and an output terminal or junction 401 of the amplifier The resistors 255 and 256 are connected to each other in series relationship and interposed between the junctions 400 and 401. The cathode and anode of the diode 257 are directly coupled to a junction 403 of the resistors (255 and 256) and to the ground, respectively. In such a circuit arrangement, the terminal of the resistor 256, which is connected to the junction 401, derives output voltage variations from the amplifier. Since the anode of the diode 257 is coupled to the ground, the portion of the negative half wave is clipped away by means of the diode 257, the waveform of the voltage variations appearing at the junction 403 is a positive half wave as indicated by numeral 259. The voltage variations developed at the junction 403 is fed to the junction 400. It is to be noted that the waveform of the voltage variations from the output terminal is in reverse polarity relationship with that of the voltage variations derived from the collector resistor 25, because the portion corresponding to each positive half cycle of the input signal appears in the reverse polarity across the collector resistor 25 as in the foregoing description while the output signal's waveform is analogous to that of the input signal. Consequently, it is understood that the two kinds of voltage variations act to reduce the magnitudes of each other at the junction 400. In the following it will be described how the reduced magnitudes at the junction 400 affect the on-off switching operation of the voltage responsive switching means 16. In FIG. 8 there is shown the waveform of the voltage variations appearing at the junction 38 of the transistor 21 and supplied to the junction 400 through the resistor 250. In this case, it is to be noted that the waveform is a negative half wave with respect to the power source potential B1 and the positive peak potential is equal to that of the power source. i.e., B1 as seen in FIG. 8. Since the magnitude of the voltage variations being appearing at the junction 38 increases with decreasing load impedance value, the peak to peak potential denoted by character v1 is changed with the variations of the value of the load impedance. In FIG. 9 there is shown the waveform of the voltage variations derived from the output terminal or junction 401 of the amplifier 10. The waveform is a positive half wave corresponding to that of the amplified input signal and the upper peak potential is lower than the power source voltage B1. With respect to the magnitude of the voltage variations of FIG. 9, attention must be paid to the following. The output impedance of the transistor amplifier is inherently relatively low, so that the amplifier behaves as if it were a constant voltage power source. Therefore, the output voltage appearing at the junction or output terminal 401 is approximately constant irrespective of the variation of the output impedance on the condition that the magnitude of the input signal to the amplifier is constant. Consequently, the peak to peak potential denoted by character v2 in FIG. 9 remains constant despite the variation of the load impedance. In FIG. 9, if R3, R4, R5 and B1 are resistance values of the resistors 251, 255 and 256, and the power source potential, respectively, then the potential difference v3 between the source power potential B1 and the valley is $v3 = (R3 \times B1/R3 + R4 + R5)$ while the potential difference v4 between the valley and the ground is $v4 = (R4 + R5)\ B1/R3 + R4 + \beta 5$ In FIGS. 10 through 13 there are shown the four instances of the waveforms of the combined voltage variations together with the voltage variations derived from the junction 38 (first voltage variations) and the voltage variations derived from the output terminal 401 (second voltage variations), according to the variations of the load impedance. In FIGS. 10 through 13 the solid line, dotted line and phantom line denote the waveforms of the combined, first and second voltage variations, respectively, and the character V denotes the on-off switching level of the transistor 271 of the voltage responsive switching means 16. It is to be noted that the on-off switching level is previously determined in the circuit design. In FIG. 10 there are shown the relationship between three kinds of waveforms in the case where the load impedance 32 is just the predetermined value. In such a case, the absolute potentials of v1 and v2 are equal to each other, so that the combined potential has no variation factor nor waveform as shown by a solid straight line. In this case, the potential indicated by a solid line is higher than the potential level V of the switching means 16, so that the voltage responsive switching means 16 remains off. In FIG. 11 there are shown the relationship between three kinds of waveforms in the case where the load impedance is higher than the minimum allowable value, wherein v2 is larger than v1 so that the combined voltage variations are higher than the preset switching voltage level. Also in this case, the voltage responsive switching means 16 remains off. On the contrary, as seen in FIG. 12, provided the load impedance is lowered below the minimum allowable value, v1 becomes larger than v2 so that the combined voltage variations have wave portions below the potential level V. In this case, the voltage responsive switching means 16 is actuated to break the circuit connection between the output terminal 36 of the amplifier 10 and the load 32. Finally, in the worst case where the load impedance is short-circuited to the ground, the potential of the output terminal 36 is reduced to zero so that only v1 exists at the junction 400. In addition, in this case, the magnitude of v1 reaches its maximum value so that the protecting operation is accomplished without failure. In FIG. 13 there is shown the relationship between two kinds of waveforms in the latest case.

The present invention has been described in connection with certain preferred embodiment; however, it is appreciated that various changes may be made in the various components and circuits without departing from the intended spirit and scope of the present invention as defined by the appended claims.

What is claimed is:

1. A protective circuit for protecting a transistor amplifier against excessive current flowing therethrough, which comprises voltage responsive switching means coupled to and deriving voltage variations from a first output terminal of said amplifier, the magnitude of said voltage variations being correspondingly varied with that of an output current supplied to a load impedance from a second output terminal of said amplifier, said second output terminal being coupled to said load impedance through a relay, said voltage responsive switching means including semiconductor switching means and said relay, said relay being connected to and controlled by said semiconductor switching means, said semiconductor switching means being rendered conductive upon the magnitude of said voltage variations attaining a preset response level thereof actuating said relay to break a circuit connection between said second output terminal and said load of said amplifier, impedance control means including at least one semiconductor device which is coupled to and derives an output voltage from said second output terminal of said amplifier for controlling the impedance of said at least one semiconductor device such that said impedance of said at least one semiconductor device is caused to decrease upon increase of the magnitude of said output voltage and such that said impedance of said at least one semiconductor device is caused to increase upon decrease of the magnitude of said output voltage, said impedance control means being coupled to said semiconductor switching means of said voltage responsive switching means and controlling the magnitude of said voltage variations derived from said first output terminal such that the magnitude of said voltage variations is caused to decrease upon increase of the magnitude of said output voltage and such that the magnitude of said voltage variations derived from said first output terminal is caused to increase upon decrease of the magnitude of said output voltage, whereby the provision of said impedance control means widens the protective range of said voltage responsive switching means.

2. A protective circuit claimed in claim 1, wherein said impedance control means further comprises rectifying means receiving and rectifying said output voltage, filtering means coupled to said rectifying means for smoothing ripple voltage variations, said filter means being coupled to and supplying the smoothed direct current to said at least one semiconductor device for varying its impedance.

3. A protective circuit for protecting a transistor amplifier against excessive current flowing therethrough, which comprises voltage responsive switching means coupled to and deriving voltage variations from a first output terminal of said amplifier, the magnitude of said voltage variations being correspondingly varied with that of an output current supplied to a load impedance from a second output terminal of said amplifier, said second output terminal being coupled to said load impedance through a relay, said voltage responsive switching means including semiconductor switching means and said relay, said relay being connected to and controlled by said semiconductor switching means, said semiconductor switching means being rendered conductive upon the magnitude of said voltage variations attaining a preset response level thereof actuating said relay to break a circuit connection between said second output terminal and said load of said amplifier, control means including rectifying means and filtering means, a first terminal of said rectifying means being coupled to and deriving an output voltage from said second output terminal of said amplifier for rectifying said output voltage, a first terminal of said filtering means being coupled to and deriving the rectified output voltage from a second terminal of said rectifying means for smoothing ripple-voltage variations, a second terminal of said filtering means being coupled to and supplying smoothed d.c. output voltage to said semiconductor switching means for preventing it from being actuated so that said relay will maintain a closed circuit connection between said output terminal and said load of said amplifier in the case where said load is maintained normally circuited.

4. A protective circuit for protecting a transistor amplifier against excessive current flowing therethrough, which comprises detecting means, voltage responsive switching means being coupled to and controlled by said detecting means, a first terminal of said detecting means being coupled to and deriving first voltage variations from a first output terminal of said amplifier, the magnitude of said first voltage variations being correspondingly varied with that of an output current supplied to a load impedance from a second output terminal of said amplifier, said second output terminal being coupled to said load impedance, a second terminal of said detecting means coupled to and deriving second voltage variations of an output voltage from said second output terminal of said amplifier, said second voltage variations being arranged such that their polarity is opposite to that of said first voltage variations so that said first and second voltage variations act to reduce the magnitude of each other when said first and second voltage variations are combined, the combined voltage variations being delivered to said voltage responsive switching means, said voltage responsive switching means including semiconductor switching means and a relay coupled to said semiconductor switching means which is caused to be rendered conductive upon said combined voltage variations attaining a preset response level thereof actuating said relay to break a circuit connection between said second output terminal and said load impedance of said amplifier, whereby the switching sensitivity varies with the variations of said load impedance, since the magnitude of said first voltage variations increases with decrease of said load impedance.

5. A protective circuit claimed in claim 4, wherein said detecting means includes a pair of first voltage dividing resistors a first terminal of which is coupled to and derives said first voltage variations from said amplifier, said first voltage variations being negative with respect to a power source potential, a second terminal of said first voltage dividing resistors being coupled to a power source bus line, a pair of second voltage dividing resistors a first terminal of which is coupled to and derives said second voltage variations from said output terminal and a second terminal of said second voltage dividing resistors is coupled to a junction of said first voltage dividing resistors, a clipping diode a cathode electrode of which is connected to the junction between said second voltage dividing resistors and an anode electrode of said clipping diode is connected directly to the ground, so that the voltage variations appearing at the junction of said second voltage dividing resistors are positive portions with respect to the potential at said junction between said second voltage dividing resistor, a filtering diode being provided for filtering and delivering said combined voltage variations to said voltage responsive switching means, the cathode electrode of said filtering diode being connected to said junction of said first voltage dividing resistors and an anode electrode thereof being connected to said voltage responsive switching means.

* * * * *